United States Patent [19]
McMahon

[11] Patent Number: 5,892,275
[45] Date of Patent: Apr. 6, 1999

[54] HIGH PERFORMANCE POWER AND GROUND EDGE CONNECT IC PACKAGE

[75] Inventor: John Francis McMahon, Phoenix, Ariz.

[73] Assignee: Intel Corporation, Santa Clara, Calif.

[21] Appl. No.: 923,084

[22] Filed: Sep. 4, 1997

Related U.S. Application Data

[63] Continuation of Ser. No. 520,492, Aug. 29, 1995, abandoned.

[51] Int. Cl.$^6$ ..................................... H01L 23/48
[52] U.S. Cl. .......................... 257/690; 257/693; 257/691; 257/692; 257/785; 439/249
[58] Field of Search .................................. 257/690, 693, 257/785, 691, 692; 439/249, 251, 265, 260, 541.5

[56] References Cited

U.S. PATENT DOCUMENTS

| | | |
|---|---|---|
| 3,912,353 | 10/1975 | Kasuya et al. ........................... 439/260 |
| 5,239,198 | 8/1993 | Lin et al. ................................. 257/693 |
| 5,266,833 | 11/1993 | Capps ...................................... 257/690 |
| 5,306,948 | 4/1994 | Yamada et al. ......................... 257/690 |
| 5,391,922 | 2/1995 | Matsui ..................................... 257/773 |

*Primary Examiner*—David B. Hardy
*Attorney, Agent, or Firm*—Blakely, Sokoloff, Taylor & Zafman LLP

[57] ABSTRACT

An integrated circuit package that receives power from a connector clipped to an edge of the package. The IC package has at least one pair of contact strips that extend along an edge of the package. The strips are connected to the power and ground pads of the integrated circuit by internal routing of the package. The connector has a plurality of conductive spring fingers that clip onto the contact strips of the package. The connector supplies power to the package through a cable connected to an external power supply. The package may have a number of separate connectors that provide different voltage levels to the integrated circuit. The IC package may have a plurality of contacts that extend from the package and are mounted to a printed circuit board.

6 Claims, 3 Drawing Sheets

HIGH PERFORMANCE POWER AND GROUND EDGE CONNECT IC PACKAGE

This is a Continuation Application of application Ser. No. 08/520,492, filed Aug. 29, 1995, now abandoned.

BACKGROUND OF THE INVENTION

1. Field of the Invention

The present invention relates to an integrated circuit package.

2. Description of Related Art

Integrated circuits (ICs) are typically located within a package that is soldered or socketed to a printed circuit board. The IC package may have contacts that extend from the package and are soldered or plugged into a socket of the board. The contacts are coupled to the integrated circuit by internal routing and wiring within the package. Some of the contacts are dedicated to electrical power and ground. The remaining contacts are dedicated to the input/output (I/O) signals of the IC. Integrated circuits are continually being developed with more and more functions. The additional functions typically require more power that must be provided by the integrated circuit package. Increasing the power provided by an integrated circuit package is typically accomplished by increasing the number of contacts dedicated to power and ground. Increasing the number of contacts increases the size and cost of the package. It would be desirable to provide an integrated circuit package that receives power through means other than the conventional contacts of the package.

SUMMARY OF THE INVENTION

The present invention is an integrated circuit package that receives power from a connector clipped to an edge of the package. The IC package has at least one pair of contact strips that extend along an edge of the package. The strips are connected to the power and ground pads of the integrated circuit by internal routing of the package. The connector has a plurality of conductive spring fingers that clip onto the contact strips of the package. The connector supplies power to the package through a cable connected to an external power supply. The package may have a number of separate connectors that provide different voltage levels to the integrated circuit. The IC package may have a plurality of contacts that extend from the package and are mounted to a printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
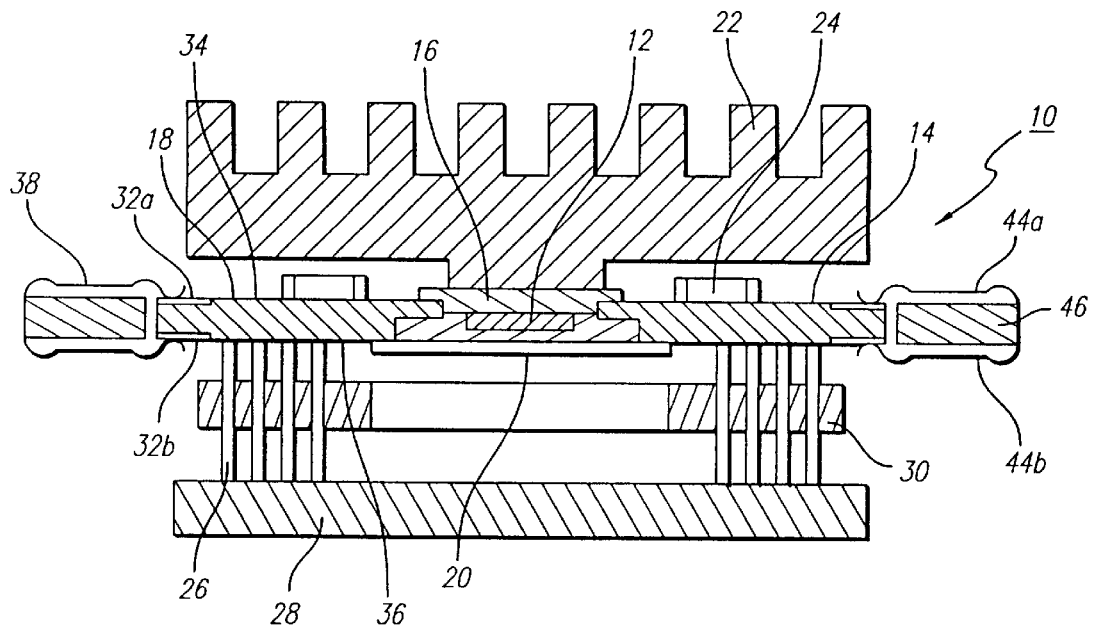
FIG. 1 is a side view of an integrated circuit package assembly of the present invention.
Figure 2:
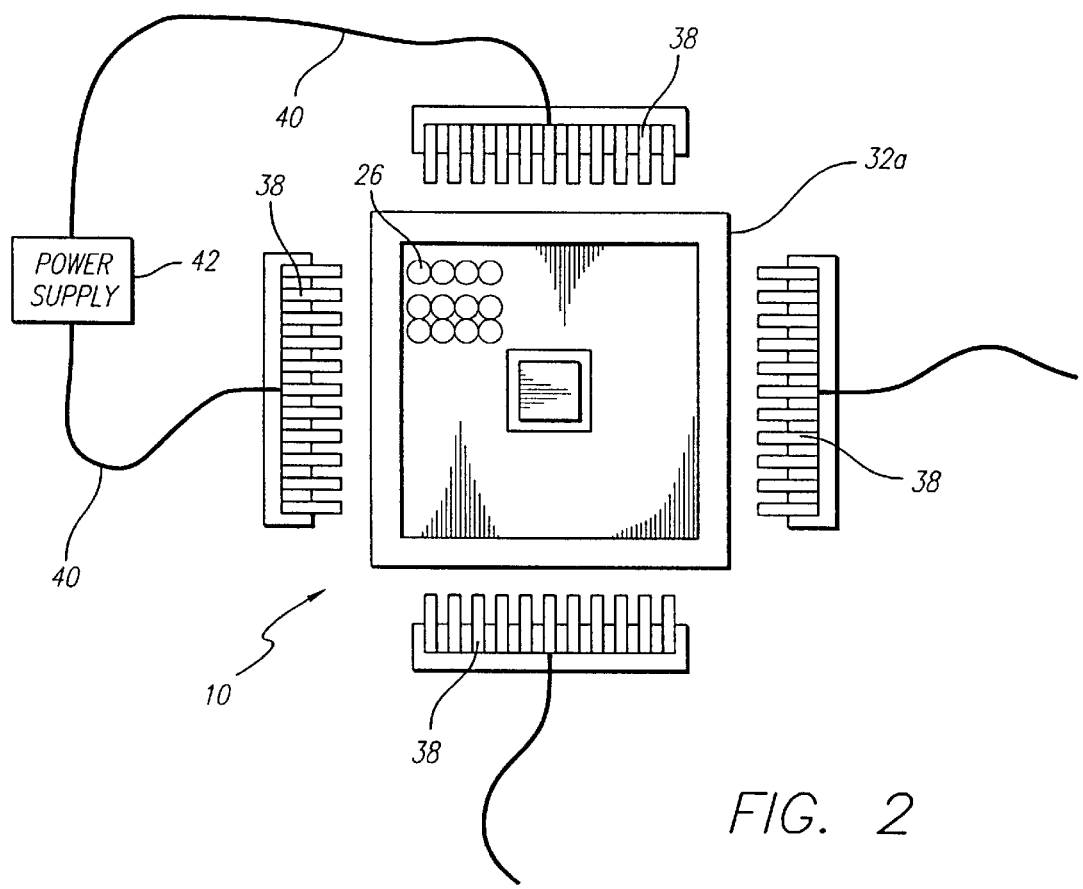
FIG. 2 is a top view of the integrated circuit package assembly without a heat sink.

Referring to the drawings more particularly by reference numbers, FIGS. 1 and 2 show an integrated circuit package assembly 10 of the present invention. The assembly 10 includes an integrated circuit 12 located within a package 14. The package 14 may include a substrate 16 that supports the integrated circuit 12. The substrate 16 is preferably mounted to a printed circuit board 18. The integrated circuit 12 may be enclosed by a lid 20 that is also attached to the printed circuit board 18. The printed circuit board 18 typically contains a plurality of bonding pads and internal routing that is connected to the integrated circuit 12 by wire bonds (not shown).

The substrate 16 may be attached to a heat sink 22. Although a substrate 16 is shown and described, it is to be understood that the integrated circuit 12 can be mounted directly to the heat sink 22. Additionally, although a printed circuit board 18 is described, it is to be understood that the package may be constructed from a ceramic process or any other means for creating internal routing. The assembly may further include capacitors 24 or other discrete devices attached to the printed circuit board 18. Although pins 18 are shown and described, it is to be understood that the package 14 may have other contents mounted to the circuit board 18.

Extending from the bottom surface of the package 14 are a plurality of pins 26. The pins 26 may be soldered or socketed to an external printed circuit board 28. The pins 26 may be structurally supported by a support bar 30 and butt soldered to surface pads located on the bottom surface of the printed circuit board 28. Alternatively, the pins 26 may be attached to the package 14 by attaching the ends of the pins 26 to plated through holes within the printed circuit board 28. The pins 26 are also soldered to corresponding plated through holes or surface pads of the printed circuit board 18. The pins 26 are typically dedicated to the input/output (I/O) signals of the integrated circuit 12.

The assembly 10 includes a pair of contact strips 32a and 32b that extend along the edges of the package 14. The contact strips 32 are typically an exposed layer of gold plated copper that is connected to the integrated circuit 12 through the internal routing and wire bonds of the package 14. There is preferably a strip 32a on the top surface 34 of the package 14 and a strip 32b on the opposite bottom surface 36 of the package 14.

The assembly 10 further includes at least one connector 38 that can be attached to the contact strips 32a and 32b of the package 14. Each connector 38 has a cable 40 that is connected to a power supply 42. Alternatively, the cables 40 can be connected to the power and ground buses of the external printed circuit board 28 through stakes (not shown) or other connection means.

The connectors 38 each have a plurality of flexible conductive fingers 44a and 44b that clamp onto the contact strips 32 to create a mechanical and electrical connection with the package 14. The top contact strip 32a may be interconnected to the ground pins of the integrated circuit 12. The bottom contact strip 32b may be interconnected to the power pins of the integrated circuit 12. The fingers 44a and 44b may be separated by a dielectric 46 so that the top fingers 44a and top contact strip 32a provide power to the integrated circuit 12, and the bottom fingers 44b and bottom contact strip 32b provide a ground for the integrated circuit 12.

Figure 3:
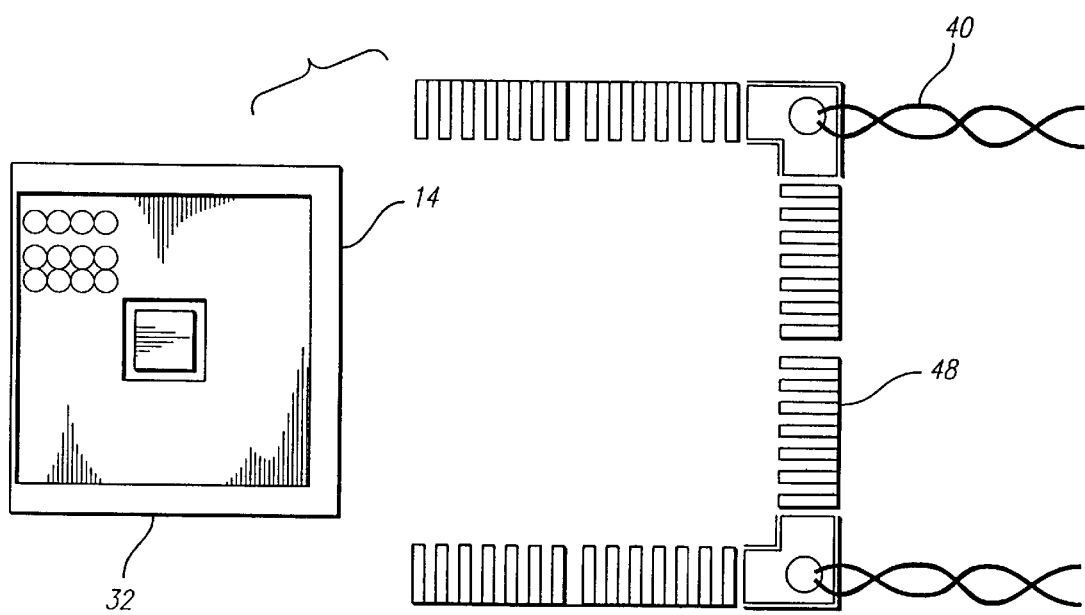
FIG. 3 is a top view of an alternate embodiment of the integrated circuit package.

FIG. 3 shows an alternate embodiment of a single C-shaped connector 48 that is coupled to three corresponding edges of contact strips 32. The single connector 48 would allow the power/ground supply to be readily attached and detached from the package 14.

Figure 4:
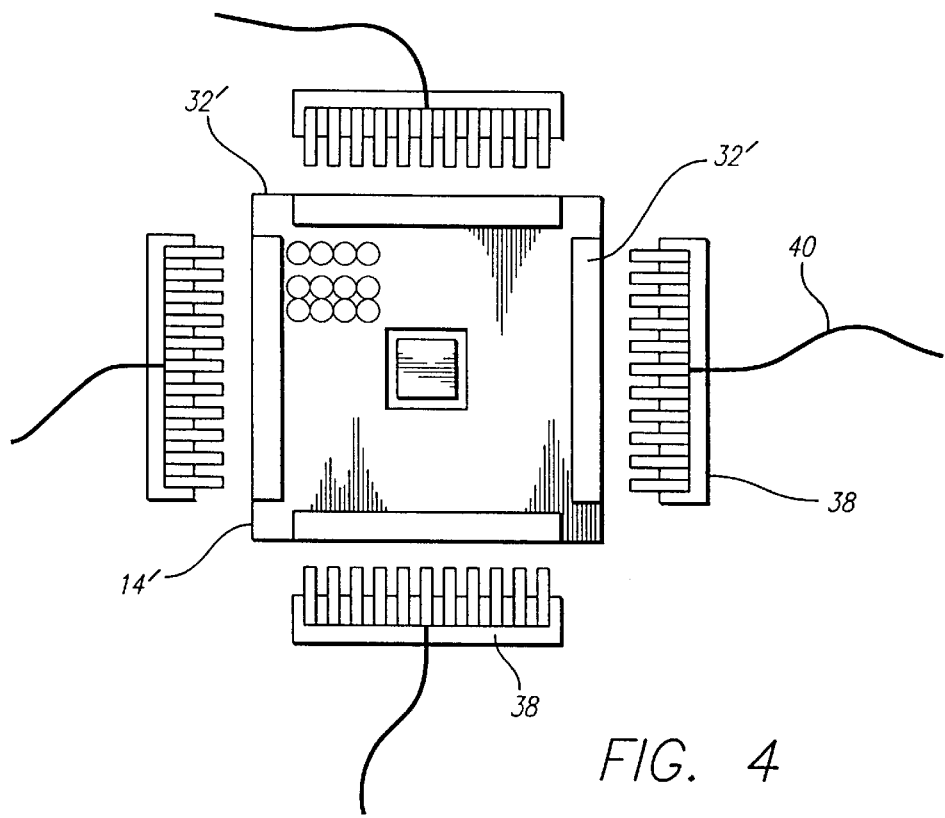
FIG. 4 is a top view of an alternate embodiment of the integrated circuit package.

FIG. 4 shows another alternate embodiment of a package 14' which has four separate pairs of strips 32' that receive four connectors 38. Each pair of strips 32' can be dedicated to either power or ground. Therefore each connector may provide either power or ground. This is to be distinguished from the embodiments of FIGS. 1–3, wherein each connector provides both power and ground. The strips 32' and corresponding connectors 38 may provide different voltage levels to the integrated circuit. For example, one of the connectors 38 may provide power at 3.3 V and the other connector 38 may provide power at 5.0 V.

Figure 5:
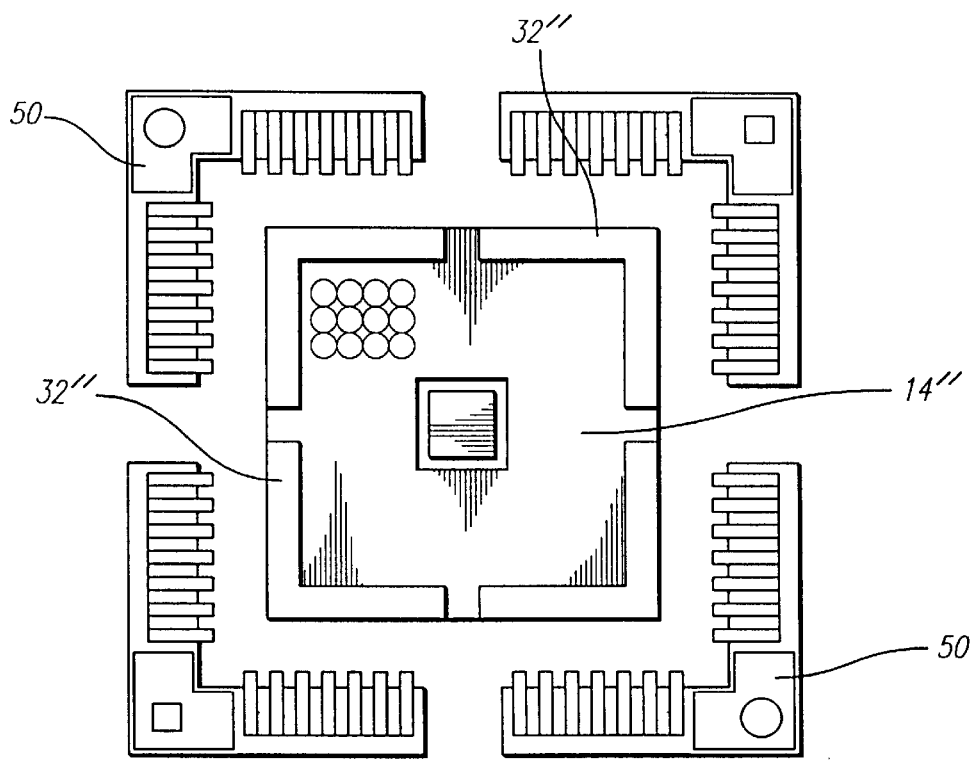
FIG. 5 is a top view of an alternate embodiment of the integrated circuit package.

FIG. 5 shows another alternate embodiment of a package 14" which has four separate strips 32" located at the corners of the package 14". The assembly contains four L-shaped connectors 50 that are clipped onto the contact strips 32". Although four separate corner strips 32" are shown and described for this embodiment, it is to be understood that the L-shaped connectors 50 can be attached to the packages shown in FIGS. 2 and 3. The strips 32" and connectors may also provide power at different voltage levels.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit package assembly, comprising:
   a package that has a pair of contact strips located on a top surface and a bottom surface of said package along a plurality of edges of said package;
   a plurality of connectors that each have a pair of flexible fingers that clip onto said contact strips, said connectors being connected to said contact strips by a friction force;
   a plurality of contacts located on said package; and,
   an integrated circuit within said package.

2. The assembly as recited in claim 1, wherein said assembly has four connectors attached to four pairs of contact strips located along four edges of said package.

3. The assembly as recited in claim 1, wherein said assembly has four connectors attached to four pairs of contact strips located at four corners of said package.

4. The assembly as recited in claim 1, further comprising a printed circuit board that is connected to said contacts and said connectors.

5. The assembly as recited in claim 1, wherein said contact strips are dedicated to power at a plurality of voltage levels.

6. The assembly as recited in claim 1, wherein said connectors are attached to a power supply.

* * * * *